US006885961B2

(12) United States Patent
Breger et al.

(10) Patent No.: US 6,885,961 B2
(45) Date of Patent: Apr. 26, 2005

(54) HYBRID TESTER ARCHITECTURE

(75) Inventors: Peter Breger, Calabasas, CA (US); Grady Borders, West Hills, CA (US)

(73) Assignee: Teradyne, Inc., Boston, MA (US)

( * ) Notice: Subject to any disclaimer, the term of this patent is extended or adjusted under 35 U.S.C. 154(b) by 72 days.

(21) Appl. No.: 10/090,585

(22) Filed: Feb. 28, 2002

(65) Prior Publication Data

US 2003/0163273 A1 Aug. 28, 2003

(51) Int. Cl.[7] .............................................. G06F 11/26
(52) U.S. Cl. ...................... 702/117; 702/118; 702/125; 714/724
(58) Field of Search ................................ 714/731, 724, 714/700, 701, 710, 711, 718, 719, 723, 732, 7; 702/117–119, 123–126, 185, 189, 66, 70, 71, FOR 103, FOR 104, FOR 110, FOR 134, FOR 135, FOR 170, FOR 171; 324/765, 73.1; 365/201, 225.7

(56) References Cited

U.S. PATENT DOCUMENTS

| | | | | |
|---|---|---|---|---|
| 6,073,259 A | * | 6/2000 | Sartschev et al. ........... 714/724 |
| 6,138,257 A | * | 10/2000 | Wada et al. ................. 714/724 |
| 6,181,614 B1 | * | 1/2001 | Aipperspach et al. ....... 365/200 |
| 6,256,237 B1 | | 7/2001 | Ho et al. ..................... 365/200 |
| 6,408,401 B1 | * | 6/2002 | Bhavsar et al. ................. 714/7 |
| 6,557,128 B1 | * | 4/2003 | Turnquist ................... 714/724 |
| 6,574,757 B1 | * | 6/2003 | Park et al. .................. 714/710 |
| 6,609,077 B1 | * | 8/2003 | Brown et al. ............... 702/117 |
| 2003/0097627 A1 | * | 5/2003 | Ku ............................. 714/711 |

OTHER PUBLICATIONS

A Post–Package Bit–Repair Scheme Using Static Latches with Bipolar–Voltage Programmable Antifuse Circuit for High–Density DRAMs, Kyeong–Sik Min et al, 2001 Symposium on VLSI Circuits Digest of Technical Papers, 2001, 2 pages., no month.

* cited by examiner

Primary Examiner—Hal Wachsman
(74) Attorney, Agent, or Firm—Teradyne Legal Department

(57) ABSTRACT

A hybrid tester architecture for testing a plurality of semiconductor devices in parallel is disclosed. The hybrid tester architecture includes per-pin formatting circuitry having data input circuitry and clock input circuitry and shared timing circuitry coupled to the clock input circuitry. The shared timing circuitry generates programmed timing signals. Per-pin data circuitry couples to the data input circuitry and generates drive data and expected data values associated with each individual device pin. The per-pin formatting circuitry responds to the programmed timing signals to produce tester waveforms in accordance with the per-pin data.

4 Claims, 4 Drawing Sheets

HYBRID TESTER ARCHITECTURE

FIELD OF THE INVENTION

The invention relates generally to automatic test equipment, and more particularly to a hybrid semiconductor tester architecture for testing semiconductor devices.

BACKGROUND OF THE INVENTION

Automatic test equipment provides the ability for semiconductor device manufacturers to test each and every device made. By testing each device, the manufacturer can sort devices having like speeds, and/or separate failed devices from passing devices. In this manner, the manufacturer is able to confidently put fully functioning devices into the marketplace.

Testing a semiconductor device typically involves applying signals to specified pins according to precise timings, and detecting the device outputs in response to the applied signals. The detected output signals are then compared to expected values to determine whether the device operated within a specified range of parameters. Many of the high-level design considerations for a semiconductor tester focus on the manner of applying and detecting signals to and from the device-under-test (DUT).

With this in mind, semiconductor tester architectures usually fall within one of two types, shared resource, or tester-per-pin. In a conventional tester-per-pin architecture, such as that shown in FIG. 1, each tester channel 10 includes separate tester resources for assignment to one pin of a DUT. Those resources include the necessary timing circuitry 12, pattern generation or data circuitry 14, formatting circuitry 16, and pin electronics 18 for applying signals to, or receiving signals from a pin of the DUT 20. A failure processing circuit handles the evaluation of expected test data versus actual data. This architecture is highly desirable when testing complex logic devices that need flexibility in testing the individual device pins.

Shared resource architectures, on the other hand, are most often found in memory testers, where multiple devices are tested simultaneously to maximize throughput and minimize test costs. A conventional shared resource architecture is shown in FIG. 2, illustrating shared resources for a 2048 channel tester. In this example, sixty-four memory devices 40 (each having thirty-two pins) may be tested with, for example, thirty-two copies 40 of the timing 42, formatting 44, and pattern generation (or data generation) circuitry 46. Fanout circuitry 48 distributes the shared formatted tester signals in parallel to the multiple DUTs 30.

After testing the devices on a shared resource tester, the failure data is typically stored in a bit-image failure memory known as a catchram 50, and subsequently downloaded to redundancy analysis circuitry 52. After the data is analyzed by the redundancy analyzers, a repair solution is sent to a laser repair station 60, along with the failed devices, where the redundant lines identified for use in repairing the device are programmed into operation.

While the conventional shared resource architecture works well for many test applications, and are often far less costly than their per-pin counterparts, different DUTs typically have bits that fail in different rows and/or columns. Consequently, the repair schemes for different devices will be different.

Moreover, some device manufacturers choose to repair devices on the tester without delays inherent in transmitting failure data to separate repair stations. Repairing DUTs on the tester generally involves writing unique repair data after testing to each device to activate internal device fuses corresponding to the desired repair solution. However, without having the ability to write the individual data for each device pin to each device, the device manufacturer cannot repair the devices in this manner. As a result, many manufacturers opt for the more expensive per-pin tester architectures in order to accomplish on-tester device repair.

What is needed and currently unavailable is a low-cost hybrid tester architecture solution that provides the per-pin benefits of unique device failure identification with the shared-resource advantages of low-cost. The hybrid tester architecture of the present invention satisfies these needs.

SUMMARY OF THE INVENTION

The hybrid tester architecture of the present invention provides a way to preserve the low cost attributes of shared resource testers without sacrificing data generation flexibility. To realize the foregoing advantages, the invention in one form comprises a hybrid tester architecture for testing a plurality of semiconductor devices in parallel. The hybrid tester architecture includes per-pin formatting circuitry having data input circuitry and clock input circuitry and shared timing circuitry coupled to the clock input circuitry. The shared timing circuitry generates programmed timing signals. Per-pin data circuitry couples to the data input circuitry and generates drive data and expected data values associated with each individual device pin. The per-pin formatting circuitry responds to the programmed timing signals to produce tester waveforms in accordance with the per-pin data.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

The hybrid tester architecture of the present invention provides a low-cost way to test semiconductor devices in parallel while preserving device data uniqueness. This is done by employing shared resources for certain tester functions, and per-pin resources for other functions. As a result, on-tester device repair is achievable with a low-cost tester.

Figure 1:
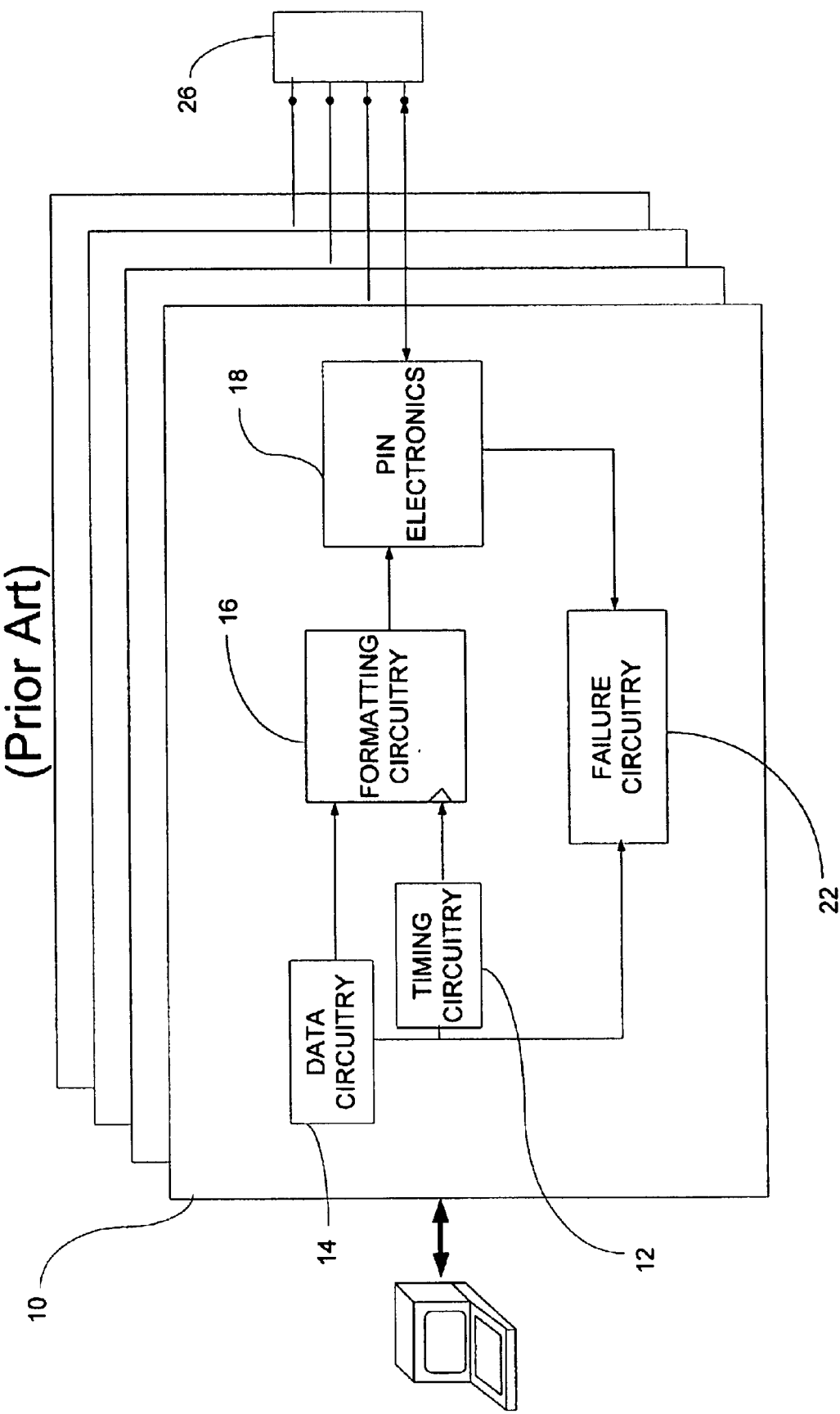
FIG. 1 is a high-level block diagram of a conventional per-pin tester architecture.
Figure 2:
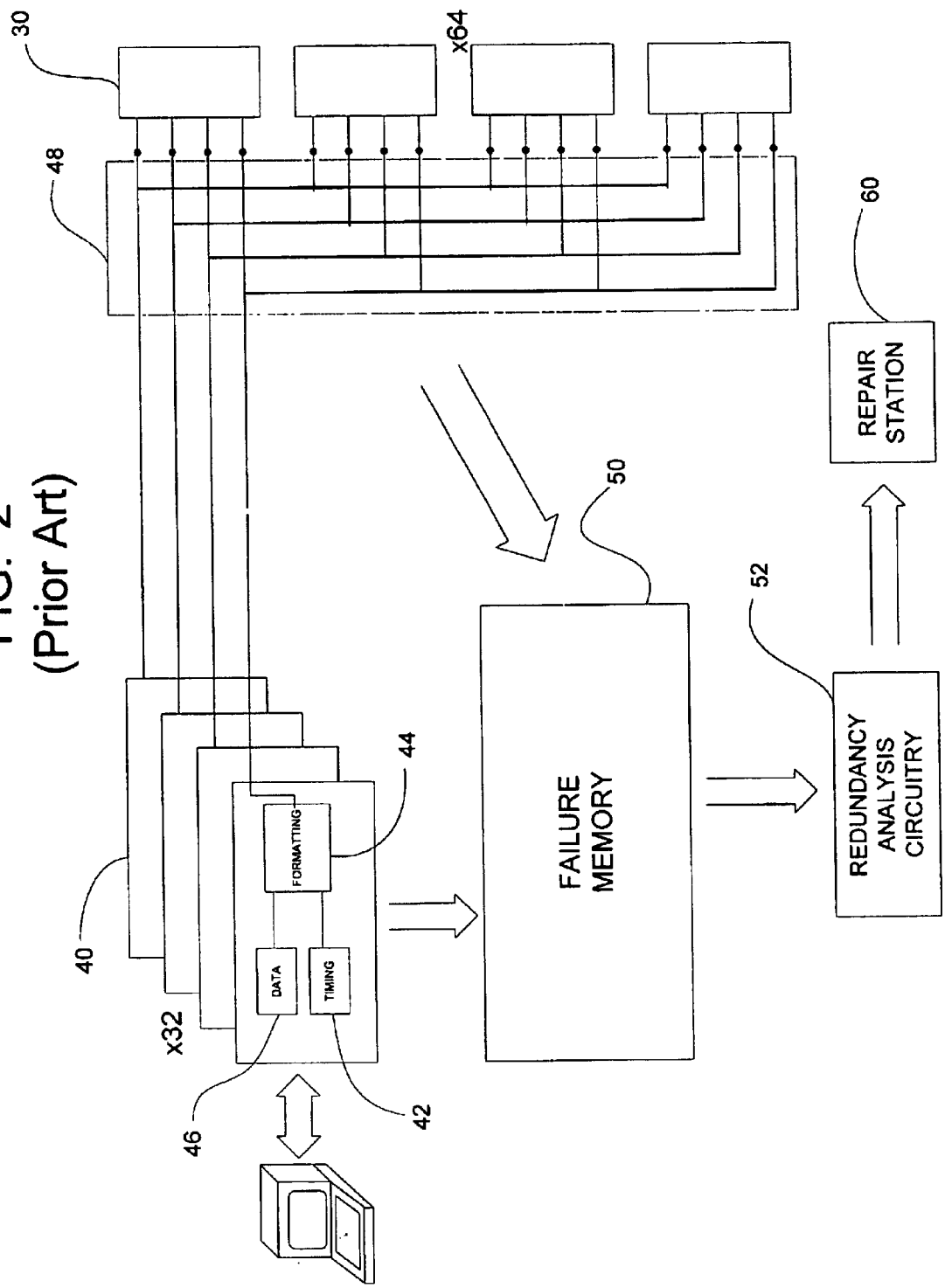
FIG. 2 is a high-level block diagram of a conventional shared resource tester architecture.
Figure 3:
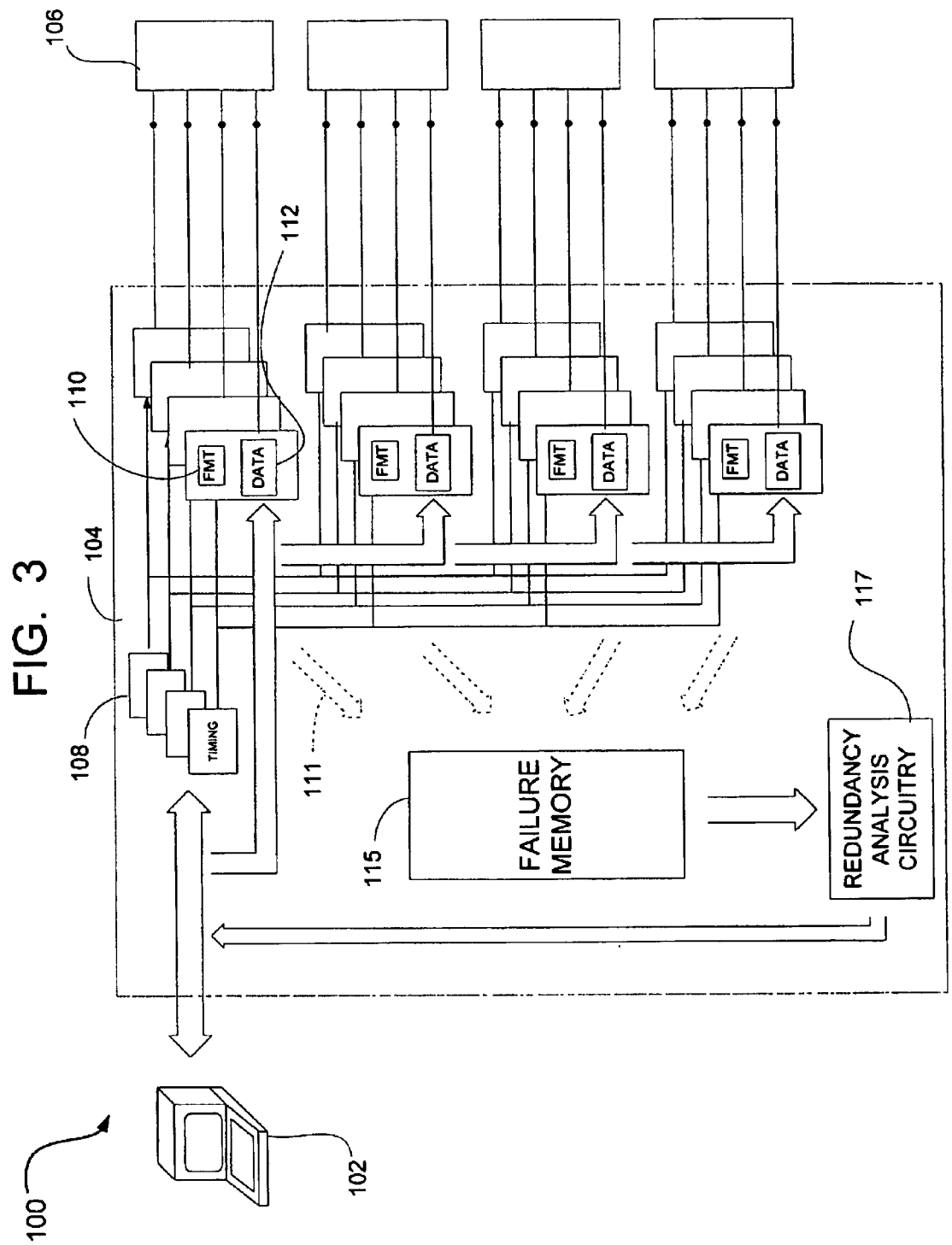
FIG. 3 is a high-level block diagram of a hybrid tester architecture according to one form of the present invention.

Referring now to FIG. 3, the hybrid tester architecture according to one form of the present invention, generally designated 100, includes a computer workstation 102 and a tester body 104 (in phantom). The tester body includes channel resources that define a hybrid tester architecture sufficient to test a plurality of DUTs 106 in parallel. A failure memory 115 and redundancy analysis circuitry 117 cooperate with the channel resources to test and repair the devices as more fully described below.

Further referring to FIG. 3, the hybrid channel resources include shared-pin timing circuitry 108, per-pin formatting circuitry 110, and per-pin data generation circuitry 112. The shared-pin timing circuitry comprises a set of thirty-two modules, or "copies" of the tester timing system resources for generating signals in parallel through the per-pin formatting circuitry 110 to the same "like" pin for all of the DUTs 106.

The per-pin formatting circuitry 110 preferably comprises digital circuitry in the form of a plurality of flip-flops (not shown), each having a data input (not shown) and a clock input (not shown) for clocking in data in response to the timing signals. In this manner, the timing signal may be synchronized to the data, as is well known in the art.

With continued reference to FIG. 3, the per-pin data generation circuitry 112 preferably comprises a plurality of dedicated memory blocks sufficient to store unique data for each pin of the DUTs 106. In the example where sixty-four devices are tested in parallel, each device having thirty-two pins, 2048 memory blocks are available to provide the per-pin data resources. Preferably, the memory blocks are realized as RAM memories to minimize costs.

Figure 4:
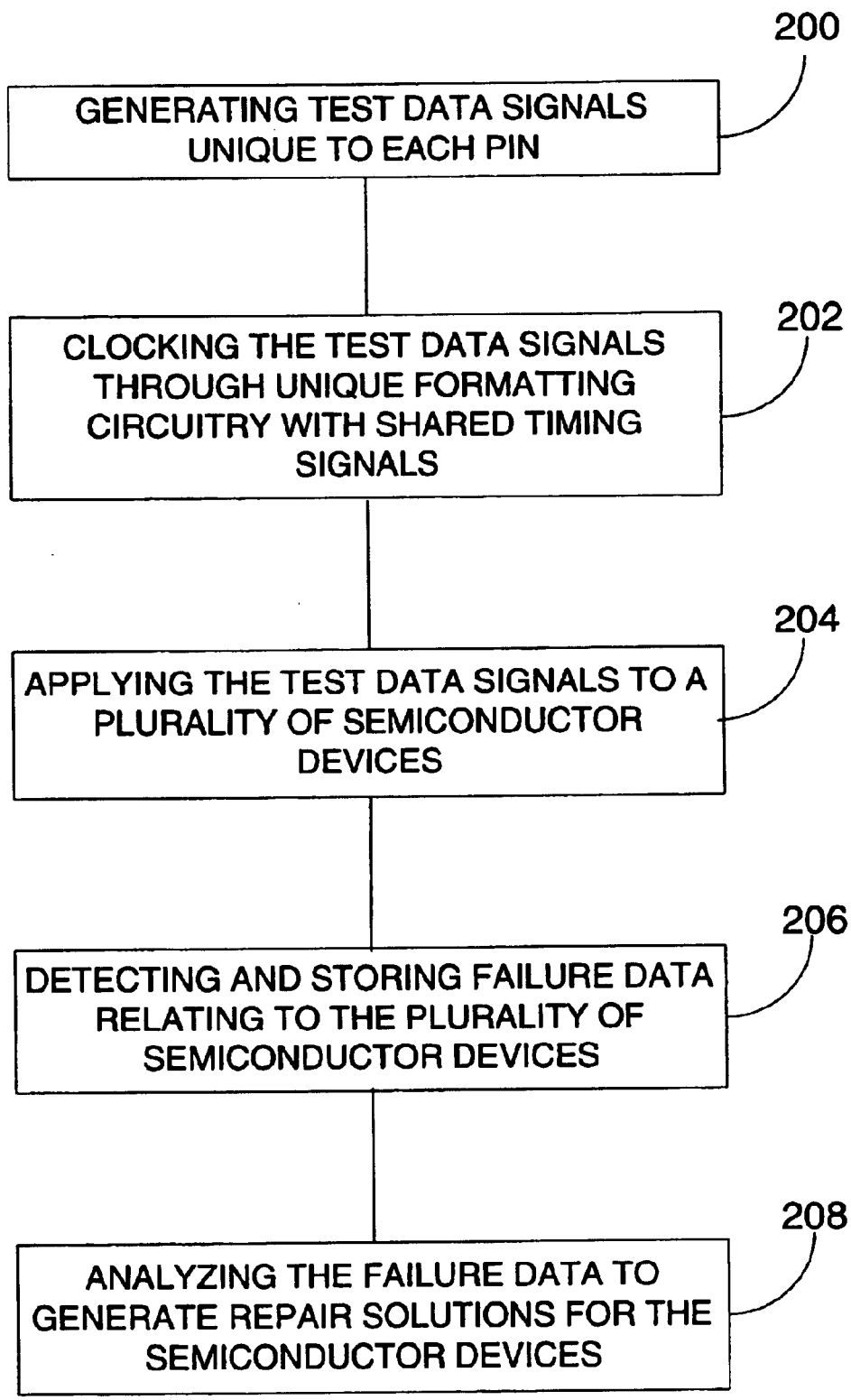
FIG. 4 is a flowchart illustrating a method of testing a plurality of semiconductor devices with the hybrid tester architecture of FIG. 3.

In operation, and consistent with the example above, each of the per-pin memory blocks generates test data signals unique to each pin, at step 200 (FIG. 4), and feeds its output to a corresponding per-pin formatting circuit 110 (for a total of 2048 blocks). As noted above, the per-pin data gets clocked through the per-pin formatting circuitry by the shared-pin timing circuitry 108, at step 202.

Prior to operation, the per-pin data generation resources 112 are programmed to provide identical data values for each of the thirty-two sets of shared timing resources 108. In this sense, the data generation circuitry may be viewed as "shared" at this stage of testing. This is because each of the DUTs 106 are identical, and go through the same initial test patterns in order to determine faults.

As testing progresses, the test signals are applied to each of the DUTs 106, at step 204, so that the tester can determine if any of the DUTs have faulty cells, and if so, where those cells lie. The failure data for each DUT 106 is routed through respective databuses 111 (shown in phantom) and stored in the failure memory 115, at step 206, as is well known in the art.

Following completion of the test, the failure data from the failure memory 115 is fed to the on-tester redundancy analysis circuitry 117. The circuitry analyzes the faulty data, at step 208, for each DUT and assigns redundant rows and columns (built into each DUT) to "fix" the device. Each redundancy solution is unique for a particular DUT (the redundant row/column addresses) and generally involves programming the DUT to incorporate certain row and column address lines. For on-tester device repair, the solution data is fed back to the computer workstation 102. Once the solutions are known, corresponding test patterns are created and fed to the per-pin data resources 112 to then generate write addresses for programming activation of the desired redundancy elements for each device.

If desired, a second test may be performed on the devices to verify the acceptability of the repair solutions for each device.

Those skilled in the art will appreciate the many benefits and advantages afforded by the present invention. Of significant importance is the preservation of low cost for testing semiconductor devices in parallel through use of shared timing and formatting resources, yet maximizing tester flexibility through the implementation of per-pin data resources.

While the invention has been particularly shown and described with reference to the preferred embodiments thereof, it will be understood by those skilled in the art that various changes in form and detail may be made therein without departing from the spirit and scope of the invention. For example, while the description herein has focused on memory testers and memory devices, the invention may be utilized on logic devices where per-pin timing is unnecessary. This provides a very low-cost solution to testing logic devices.

What is claimed is:

1. A hybrid tester architecture for testing a plurality of semiconductor devices in parallel, each semiconductor device having a predetermined number of pins, the hybrid tester architecture including:

a plurality of formatting circuits, each having data input circuitry and clock input circuitry, the plurality of formatting circuits adapted for a one-to-one correspondence with each pin of each semiconductor device;

shared timing circuits coupled to the clock input circuitry, each of the shared timing circuits operative to generate programmed timing signals and adapted for coupling to more than one pin of the semiconductor devices; and a plurality of data circuits coupled to the data input circuitry, each data circuit of the plurality of data circuits adapted for a one-to-one correspondence with each pin of each semiconductor device and operative to generate drive data associated with each individual device pin.

2. A hybrid tester architecture according to claim 1 wherein:

the plurality of data circuits comprises a plurality of memory blocks, each memory block corresponding to one of the predetermined number of pins.

3. A hybrid tester architecture according to claim 1 and further including:

a capture memory for storing fail data relating to the plurality of semiconductor devices; and redundancy analyzer circuitry for processing the fail data into a repair solution.

4. A hybrid tester architecture according to claim 3 and further including a computer workstation and wherein the redundancy analyzer is coupled to the computer workstation and operative, after generating repair solutions, to transmit the repair solutions to the computer workstation.

* * * * *